US 9,881,729 B2

(12) United States Patent
Aust (10) Patent No.: US 9,881,729 B2
(45) Date of Patent: Jan. 30, 2018

(54) BROADBAND POWER AMPLIFIER HAVING HIGH EFFICIENCY

(71) Applicant: Raytheon Company, Waltham, MA (US)

(72) Inventor: Timothy D. Aust, Thousand Oaks, CA (US)

(73) Assignee: RAYTHEON COMPANY, Waltham, MA (US)

( * ) Notice: Subject to any disclaimer, the term of this patent is extended or adjusted under 35 U.S.C. 154(b) by 258 days.

(21) Appl. No.: 14/841,881

(22) Filed: Sep. 1, 2015

(65) Prior Publication Data
US 2015/0371770 A1 Dec. 24, 2015

Related U.S. Application Data

(62) Division of application No. 13/891,371, filed on May 10, 2013, now Pat. No. 9,160,289.

(51) Int. Cl.
*H03F 1/00* (2006.01)
*H01F 27/40* (2006.01)
(Continued)

(52) U.S. Cl.
CPC ......... *H01F 27/40* (2013.01); *H01F 27/2823* (2013.01); *H01F 27/29* (2013.01); *H03F 1/565* (2013.01); *H03F 3/193* (2013.01); *H03F 3/211* (2013.01); *H03F 3/217* (2013.01); *H03F 3/2178* (2013.01); *H03F 3/245* (2013.01); *H03F 3/601* (2013.01); *H03F 3/604* (2013.01);
(Continued)

(58) Field of Classification Search
CPC ........................................................ H03F 1/00
USPC ................................................. 330/165, 276
See application file for complete search history.

(56) References Cited

U.S. PATENT DOCUMENTS 6,504,732 B2 * 1/2003 Abe ..................... H02M 1/096
363/16
7,746,173 B1 6/2010 Tserng et al.
(Continued)

FOREIGN PATENT DOCUMENTS

CN 102291092 A 12/2011
EP 2001128 A1 12/2008
WO 2013031865 A1 3/2013

OTHER PUBLICATIONS

Nathan M. Neihart, et al., "A Dual-Band 2.45/6 GHz CMOS LNA Utilizing a Dual-Resonant Transformer-Based Matching Network", IEEE Transactions on Circuits and Systems I: Regular Papers, IEEE, U.S., vol. 59, No. 8, Aug. 1, 2012, pp. 1743-1751.
(Continued)

*Primary Examiner* — Henry Choe
(74) *Attorney, Agent, or Firm* — Cantor Colburn LLP (57) ABSTRACT

A wideband power amplifier module includes a plurality of switch mode amplifiers and a plurality of impedance amplifier modules. Each switch mode amplifier includes an input to receive an input signal, and an RF output to output an RF power signal. The switch mode amplifier includes at least one semiconductor switch formed from gallium nitride (GaN). Each impedance amplifier module includes an output electrically connected to the RF output of a respective switch mode amplifier. The impedance amplifier module is configured to inject at least one impedance control signal to each RF output.

1 Claim, 9 Drawing Sheets

(51) Int. Cl.
 H03F 3/217 (2006.01)
 H03F 3/24 (2006.01)
 H01F 27/28 (2006.01)
 H01F 27/29 (2006.01)
 H03F 1/56 (2006.01)
 H03F 3/193 (2006.01)
 H03F 3/21 (2006.01)
 H03F 3/60 (2006.01)

(52) U.S. Cl.
 CPC .. H03F 2200/297 (2013.01); H03F 2200/301 (2013.01); H03F 2200/306 (2013.01); H03F 2200/321 (2013.01); H03F 2200/387 (2013.01); H03F 2200/39 (2013.01); H03F 2200/391 (2013.01); H03F 2200/393 (2013.01); H03F 2200/399 (2013.01); H03F 2200/423 (2013.01); H03F 2200/429 (2013.01); H03F 2200/451 (2013.01); H03F 2200/541 (2013.01)

(56) References Cited

U.S. PATENT DOCUMENTS

| | | | |
|---|---|---|---|
| 8,054,126 | B2 | 11/2011 | Yang et al. |
| 8,174,322 | B2 | 5/2012 | Van Der Heijden et al. |
| 8,253,495 | B2 | 8/2012 | Bouisse |
| 8,269,555 | B2 | 9/2012 | Van Der Heijden et al. |
| 8,576,010 | B2 | 11/2013 | Yanduru et al. |
| 8,698,564 | B2 | 4/2014 | Kamiyama et al. |
| 8,717,102 | B2 | 5/2014 | Wilson et al. |
| 8,749,306 | B2 | 6/2014 | Pengelly |
| 2002/0057183 | A1 | 5/2002 | Oldfield |
| 2003/0151929 | A1* | 8/2003 | Figueroa ........... H02M 3/33507 363/21.01 |
| 2003/0214359 | A1 | 11/2003 | Sasho et al. |
| 2005/0083122 | A1 | 4/2005 | Tayrani et al. |
| 2006/0087384 | A1 | 4/2006 | Ezzendine |
| 2006/0109695 | A1 | 5/2006 | Ren et al. |
| 2007/0008034 | A1 | 1/2007 | Tayrani |
| 2007/0018720 | A1 | 1/2007 | Wright |
| 2007/0241814 | A1 | 10/2007 | Kayano |
| 2009/0195324 | A1 | 8/2009 | Li et al. |
| 2010/0164645 | A1 | 7/2010 | Kobayashi |
| 2012/0105147 | A1 | 5/2012 | Harris et al. |

OTHER PUBLICATIONS

European Supplemental Search Report for EP14794237, dated Nov. 30, 2016, 9 pages.
European Extended Search Report for EP14794237, dated Apr. 4, 2017, 30 pages.
Abe et al., "Inverse Class-F AIGaN/GaN HEMT Microwave Amplifier Based on Lumped Element Circuit Synthesis Method," IEEE Transactions on Microwave Theory and Techniques, vol. 56, No. 12, Dec. 2008, pp. 1-6.
Carrubba et al., "A Novel Highly Efficient Broadband Continuous Class-F RFPA Delivering 74% Average Efficiency for an Octave Bandwidth," IEEE 2011, pp. 1-4.
Chen, "Fractal-Shaped Stepped-impedance transformers for wideband application," Microwave and Optical Technology Letters, vol. 49, Issue 7, pp. 1628-1630, Jul. 2007.
Dupuy et al.,"Class-F Power Amplifier Using a Multi-Frequency Composite Right/Left-Handed Transmission Line Harmonic Tuner," IEEE, 2005, pp. 1-4.
Goto et al., "Efficiency Enhancement of Doherty Amplifier with Combination of Class-F and Inverse Class-F Schemes for S-Band Base Station Application," IEEE MIT-S Digest, 2004, pp. 1-4.
Grebennikov et al., "Load Network Design Technique for Class F and Inverse Class F PAs," High Frequency Design, Class-F Amplifiers, Summit Technical Media, May 2011, pp. 1-11.
Grebennikov et al.,"High-Efficiency Doherty Power Amplifiers: Historical Aspect and Modern Trends," Contributed Paper, Proceedings of the IEEE, vol. 100, No. 12, Dec. 2012, pp. 1-30.
Hone et al.,"Controlling Active Load-Pull in a Dual-Input Inverse Load Modulated Doherty Architecture," IEEE, IEEE Transactions on Microwave Theory and Techniques, vol. 60, No. 6, Jun. 2012, pp. 1-8.
Hong et al.,"Single-Ended and Differential Radial Power Combiners Implemented with a Compact Broadband Probe," IEEE Transactions on Microwave Theory and Techniques, vol. 58, No. 6, Jun. 2010, pp. 1-8.
Honjo, "A Simple Circuit synthesis method for microwave Class-F ultra-high-efficiencey amplifiers with reactance-compensation circuits," Pergamon, Solid-State Electronics 44 2000, pp. 1477-1482.
ISR/WO for related PCT Application No. PCT/US2014/018925, dated Aug. 28, 2014, pp. 1-18.
Lee, "The Design of CMOS Radio-Frequency Integrated Circuits," Mar. 2004, Summary only, pp. 1-2.
Nesimoglu, "Second Harmonic Injecting Technique for Low Intermodulation Distortion RF Microwave Amplifiers," 1997 High Frequency PostGraduate Student Colloquium, University of Leeds, Sep. 1997, pp. 1-6.
Phinney et al., "Multi-Resonant Microfabricated Inductors and Transformers," 2004 35th Annual IEEE Power Electronics Specialists Confernece, Germany, 2004, pp. 1-10.
Raab, "Maximum Efficiency and Output of Class-F Power Amplifiers," IEEE Transactions on Microwave Theory and Techniques, vol. 49, No. 6, Jun. 2001, pp. 1-5.
Rejaei et al.,"Concentric Ring Model of Monolithically Integrated Circular Spiral Transformers," Microwave Conference, 2001, pp. 1-4.
Rudiakova, "BJT Class-F Power Amplifier Near Transistion Frequency," IEEE Transactions on Microwave Theory and Techniques, vol. 53, No. 9, Sep. 2005, pp. 1-6.
Seki et al., "Microwave Class-F InGaP/GaAs HBT Power Amplifier Considering up to 7th-Order Higher Harmoic Frequencies," IEICE Trans. Electron., vol. E89-C, No. 7, Jul. 2006, pp. 1-6.
Spirito et al., "Low-Loss Passives for 2nd-Harmoic Termination Control in Power Amplifiers for Mobile Applications," IEEE, 2003, pp. 1-4.
The Univeristy of Electro-Communications, "Microwave Class-F InGaP/GaAs HBT Power Amplifier Considering up to 7th-Order Higher Harmoic Frequencies," Abstract and Graphs, 2006, pp. 1.
Tuffy, "High Efficiency Switch-Mode Power Amplifier Design for 4G Multiband Systems," RF and Microwave Research Group University College Dublin, Dec. 2011, Efficient Devices for Radio Systems SIG, pp. 1-54.
Winslow, "Conical Inductors for Broadband Applications," Application Notes, IEEE Microwave Magazine, Mar. 2005, pp. 1-3.

* cited by examiner

BROADBAND POWER AMPLIFIER HAVING HIGH EFFICIENCY

DOMESTIC PRIORITY

This application is a division of U.S. patent application Ser. No. 13/891,371, filed May 10, 2013, the disclosure of which is incorporated by reference herein in its entirety.

BACKGROUND

The present disclosure relates generally to broadband amplifiers, and more specifically, a high efficiency switch mode broadband power amplifier.

Conventional commercial off-the-shelf (COTS) solid state transistor amplifiers combine multiple low power amplifiers to handle high power levels, such as kilowatt power levels or higher. The amplifiers utilized on conventional COTS amplifiers are traveling wave tube amplifiers (TWTAs). However, TWTAs exhibit poor power added efficiency (PAE). For example, a typical COTS amplifier receiving an input signal of 1 kilowatt (kW) generates an output having low PAE ranging from 5% to 20%. Low PAE results in loses in operation modes of amplifiers, such as class AB & Class B operations. Accordingly, it is desirable to provide a COTS broadband amplifier that handles high power level while having an increased PAE.

SUMMARY

A wideband power amplifier module includes a plurality of switch mode amplifiers and a plurality of impedance amplifier modules. Each switch mode amplifier includes an input to receive an input signal, and an RF output to output an RF power signal. The switch mode amplifier includes at least one semiconductor switch formed from gallium nitride (GaN). Each impedance amplifier module includes an output electrically connected to the RF output of a respective switch mode amplifier. The impedance amplifier module is configured to inject at least one impedance control signal to each RF output.

In another embodiment of the disclosure, a switch mode amplifier comprises an input to receive an input signal having a frequency. The switch mode amplifier also includes an RF output to output an RF power signal. The switch mode amplifier further includes at least one semiconductor switch formed from gallium nitride (GaN).

In yet another embodiment of the disclosure, a coupled resonator transformer to output a resonant frequency signal that drives a switch mode amplifier comprises a primary unit and a secondary unit. The primary unit includes a primary winding to receive an input signal that induces an electromagnetic field. The secondary unit is separated from the primary unit via an air gap, and includes an annular-shaped secondary winding that realizes a pre-amplified signal induced by the electromagnetic field. The coupled resonator transformer further includes a tapered cone winding disposed within the secondary winding. The tapered cone winding includes a center-tap terminal connected to a resonating capacitor to generate a resonant frequency output signal based on the pre-amplified signal.

In still another embodiment, a method of increasing a power added efficiency (PAE) of a wideband power amplifier module including a semiconductor switch formed from gallium nitride (GaN) comprises inputting an input power signal to the GaN semiconductor switch. The method further includes amplifying the input power signal via the GaN semiconductor switch to generate an RF output power signal that includes at least one harmonic. The method further includes injecting at least one impedance control signal into RF output power signal that cancels the at least one harmonic such that PAE of the wideband power amplifier module increases.

DETAILED DESCRIPTION

Figure 1:
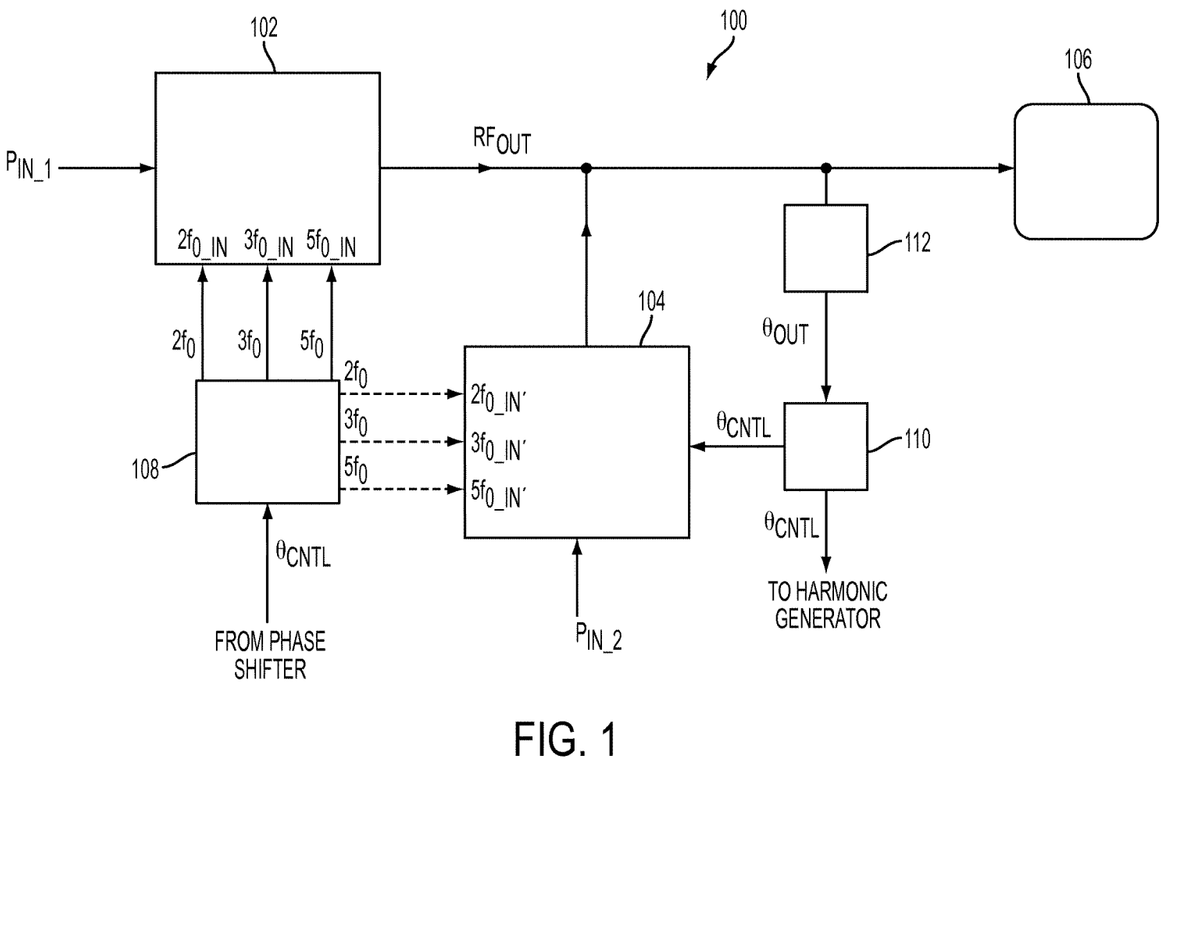
FIG. 1 is a block diagram illustrating a wideband power amplifier module according to at least one embodiment.

Referring now to FIG. 1, a wideband power amplifier module 100 is illustrated according to an embodiment of the disclosure. The wideband power amplifier module 100 is capable of providing increased PAE, while providing one or more signal carriers. In at least one embodiment, the wideband power amplifier module 100 may increase PAE across frequencies ranging from about 500 megahertz (MHz) to about 2 gigahertz (GHz), while providing five multiple signal carriers.

The wideband power amplifier module 100 may be configured, for example, as a broadband octave bandwidth amplifier. More specifically, the wideband power amplifier module 100 may operate at various frequency bands including, but not limited to Super High Frequency (SHF), Ultra High Frequency (UHF), L-band and S-band. The SHF band includes frequencies (RF) ranging from about 3 GHz (about 3,000 MHz) to about 30 GHz. The UHF band includes radio frequencies of electromagnetic waves ranging from about 300 MHz to about 3 GHz. The L-band includes four different bands of the electromagnetic spectrum ranging from about 40 GHz to about 60 GHz (NATO standard), about 1 GHz to about 2 GHz (IEEE standard), about 1565 nm to about 1625 nm (optical standard), and about 3.5 micrometers (infrared astronomy standard). The standard S-band may refer to the microwave band of the electromagnetic spectrum, and includes radio waves with frequencies that range from 2 GHz to 4 GHz. The 10-cm radar short-band may range from about 1.55 GHz to about 5.2 GHz.

Referring further to FIG. 1, the wideband power amplifier module 100 comprises a carrier amplifier module 102, and an impedance amplifier module 104. The carrier amplifier module 102 has an input to receive an input power signal ($P_{IN\_1}$) having a fundamental frequency ($f_0$), and an RF output to output an RF power signal ($RF_{OUT}$) to a load 106. The frequency of $P_{IN}$ may range from about 500 MHz to about 2 GHz. In at least one embodiment, the carrier amplifier module 102 is a Class-F mode amplifier. Class-F amplifiers produce multiple harmonics ($2f_0$, $3f_0$, $5f_0$, etc.) at the output, which lower the PAE of the amplifier at high frequencies, for example 500 MHz or above. However, at least one embodiment of the disclosure includes a feature of controlling the harmonics of the carrier amplifier module 102 such that the PAE is increased. More specifically, the carrier amplifier module 102 includes one or more harmonic inputs (e.g., $2f_{0\_IN}$, $3f_{0\_IN}$, $5f_{0\_IN}$) to receive a respective harmonic signal ($2f_0$, $3f_0$, $5f_0$, etc.). The harmonic signals may be provided by a harmonics generator 108.

The impedance amplifier module 104 may include a Class-F inverse amplifier. The impedance amplifier module 104 has an input to receive an input power signal ($P_{IN\_2}$) having a fundamental frequency ($f_0$). The fundamental frequency of the $P_{IN\_2}$ may match the fundamental frequency of $P_{IN\_1}$. The output of the impedance amplifier module 104 is coupled to the output of the carrier amplifier module 102. The impedance amplifier module 104 is configured to inject at least one impedance control signal to the output ($RF_{OUT}$) of one or more switch mode amplifiers. The impedance control signal may be signal having a frequency that is inverse with respect to a harmonic frequency of the carrier amplifier module 102. Similar to the carrier amplifier module 102, the impedance amplifier module 104 may include one or more harmonic inputs (e.g., $2f_{0\_IN'}$, $3f_{0\_IN'}$, $5f_{0\_IN'}$) to receive a respective harmonic signal ($2f_0$, $3f_0$, $5f_0$, etc.). The harmonic signals may be provided by the harmonics generator 108 as mentioned above.

The wideband power amplifier module 100 may further include a phase shifter module 110 and a phase detector 112. The phase shifter module 110 may control the impedance of the wideband power amplifier module 100 by adjusting at least one of a phase and an amplitude of the output signal generated by the impedance amplifier module 104.

The phase detector 112 includes an input connected to $RF_{OUT}$. The phase detector 112 generates a phase signal ($\theta_{OUT}$), which indicates a RF phase of the RF power. Accordingly, the phase shifter module 110 determines the phase of the RF power based on $\theta_{OUT}$, and generates one or more inverse injection control signals ($\theta_{CNTL}$). The inverse injection signal ($\theta_{CNTL}$) has a phase that is 180 degrees with respect to the RF phase of the RF power signal, and is configured to cancel one or more of the harmonics generated by the carrier amplifier module 102. For example, an inverse injection signal may be injected by the impedance amplifier module 104 into $RF_{OUT}$. The harmonics generator 108 may also receive inverse injection signal ($\theta_{CNTL}$) from the phase shifter module 110. Accordingly, the harmonics generator 108 may generate an inverse second harmonic injections signal, for example, which may be injected into the carrier amplifier module 102 via $2f_{0\_IN}$, thereby eliminating the second harmonic ($2f_0$) realized at the RF output. By eliminating one or more harmonics from $RF_{OUT}$, the PAE of the wideband power amplifier module 100 may be increased.

Although the phase shifter module 110 is described above as determining one or more phases existing at the $RF_{OUT}$ based on $\theta_{OUT}$ provided by the phase detector 112, it is appreciated that the phase detector 112 may be omitted and the phase shifter module 110 may be configured as a variable phase shifter that may be tuned in response to an input phase voltage.

Figure 2:
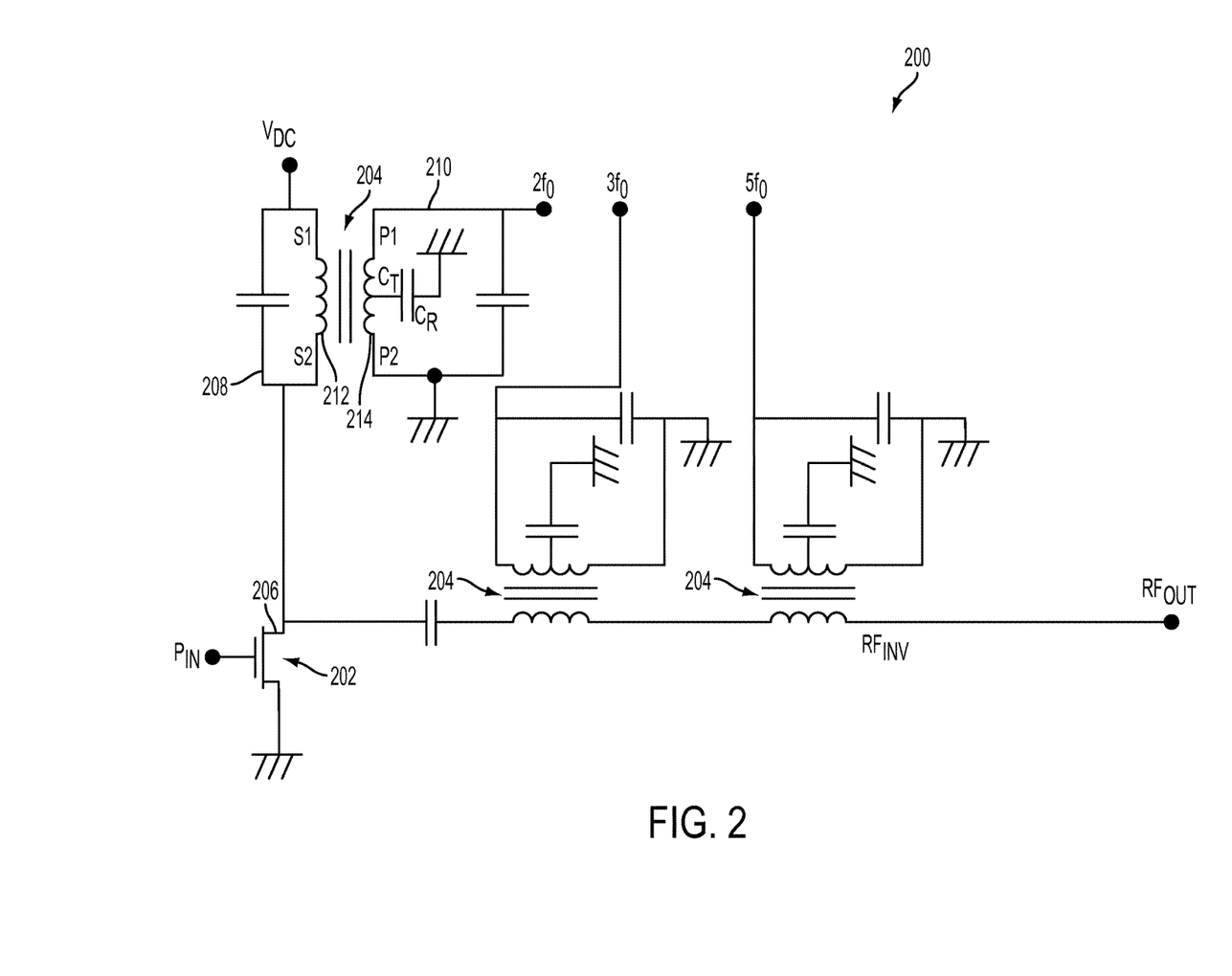
FIG. 2 is a schematic of a carrier amplifier module including a switch mode amplifier and a plurality of coupled resonator transformers according to at least one embodiment.

Referring now to FIG. 2, a schematic of a carrier amplifier module 200 according to at least one embodiment is illustrated. The carrier amplifier module 200 may include a switch mode amplifier 202 and at least one coupled resonator transformer 204. Although a single switch mode amplifier 202 is illustrated, a plurality of switch mode amplifiers 202 may be included in the carrier amplifier module 200 to generate individual RF power outputs (e.g., $P_{OUT\_1}$, $P_{OUT\_2}$, $P_{OUT\_3}$, etc.). Each of the RF power outputs may be combined to generate an increased combined RF power output, as discussed in greater detail below. Further, the at least one resonator transformer 204 may include a plurality of resonator transformers 204, as further illustrated in FIG. 2. Each resonator transformer 204 is configured to receive a respective harmonic signal, i.e., $2f_0$, $3f_0$, $5f_0$, etc. The harmonic signal may be provided by a harmonic generator, as mentioned above.

The switch mode amplifier 202 may be formed from a high electron mobility transistor (HEMT) semiconductor switch 206. The semiconductor switch 206 includes a drain terminal, a gate terminal, and a source terminal. The drain terminal is configured to receive the input signal. The input signal may be an alternating current (AC) signal providing an AC drain voltage or a direct current (DC) signal providing a DC drain voltage (Vdc). The gate terminal is configured to receive a switch signal. The switch signal may be a low voltage signal, for example a signal having a voltage ranging from about 5 volts (V) to about 10 V. The signal may be provided from a separate low voltage amplifier or a microcontroller. The source terminal is configured to output the RF power. The RF power may range, for example, from about 50 watts (W) to about 500 W. Accordingly, a source voltage, i.e., RF voltage, may be realized at the source terminal in response to applying the switch signal to the gate terminal.

The PAE of the semiconductor switch 206 may be determined based on the differential between the drain voltage and the source voltage. Conventional amplifiers exhibit low PAE at high frequencies, such as frequencies ranging from about 500 MHz to about 2 GHz. For example, a conventional amplifier including a semiconductor switch 206 that inputs 100 V at the drain terminal may output only 10 V at the source voltage. In other words, the conventional amplifier provides a PAE of only 10%.

In at least one embodiment of the disclosure, the semiconductor switch 206 is field effect transistor (FET) formed from gallium nitride (GaN), which unexpectedly exhibits a non-linear capacitance in response to the drain voltage exceeding about 40 V. The non-linear capacitance, however, increases the drain efficiency realized at the drain terminal. That is, the voltage differential between the drain voltage at the drain voltage and the RF voltage at the source terminal is reduced, as discussed in greater detail below.

Figure 3A:
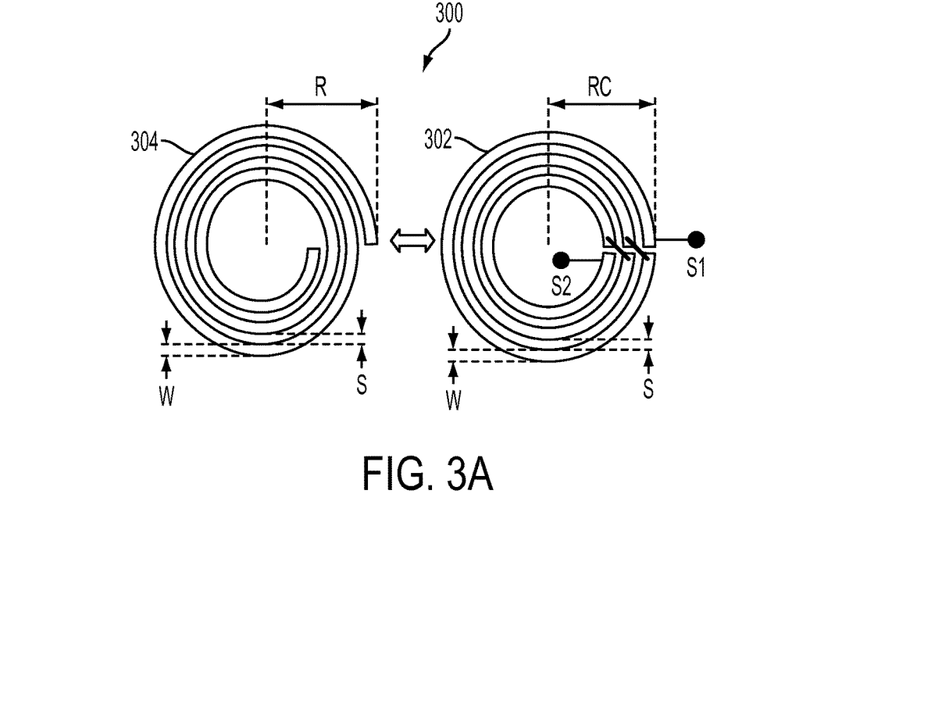
FIGS. 3A-3B are isometric views of a primary unit included with a coupled resonator transformer according to an embodiment of the disclosure.
Figure 3B:
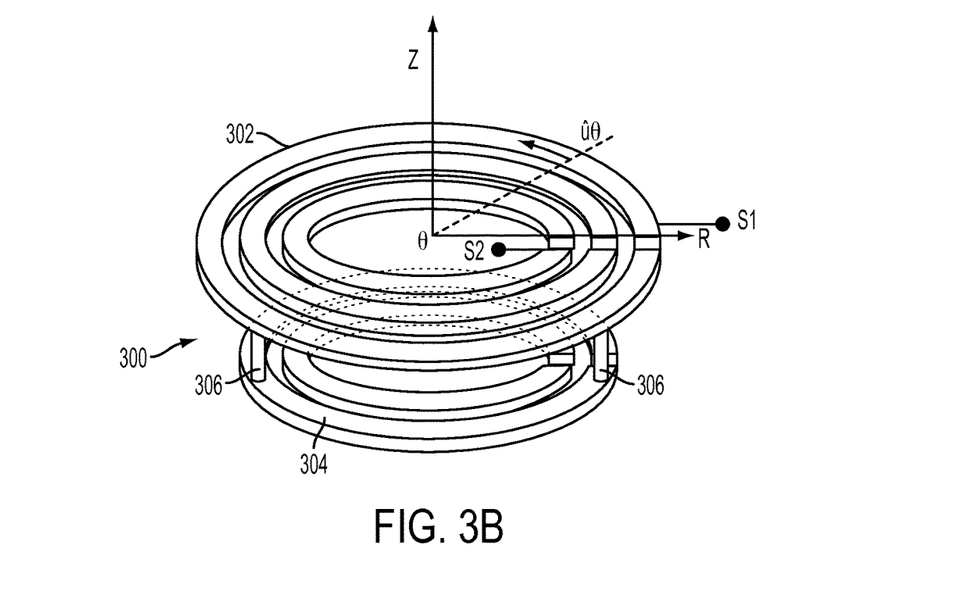

Each coupled resonator transformer 204 includes a primary unit 208 and a secondary unit 210 separated from the primary unit 208 via an air gap. The primary unit 208 includes a primary winding 212 extending between a first terminal (S1) and a second terminal (S2). The primary winding 212 is configured to receive an input signal that induces a primary voltage generating an electromagnetic field. The primary winding 212 may be formed as a stacked annular winding 300 as illustrated in FIGS. 3A-3B. The stacked annular winding 300 includes a first primary annular 302 and a second primary annular 304. The first and second primary annulars 302, 304 include a winding that extends concentrically in a spiral to form a plurality of coils. Each coil has a width (w) and is separated from each other by a spacing distance (s). The first and second primary annulars 302, 304 are vertically stacked with respect to one another. One or more electrically conductive vias 306 connect the first and second primary annulars 302, 304 in series with one another. The vertical cross-section of the first and second primary windings 302, 304 lie in the r-z plane, and a unit vector ($\hat{u}_\theta$) extends in the azimuthal direction. A void extends vertically i.e., along the Z-axis, and through the first and second windings 302, 304.

Referring again to FIG. 2, the secondary unit 210 includes a secondary winding 214 extending between a first terminal (P1) and a second terminal (P2). The secondary winding 214 is configured to realize the electromagnetic field generated by the primary winding 212. That is, the electromagnetic field is transferred across the air gap to the secondary winding 214 such that a pre-amplified signal may be generated at the secondary unit 210. The secondary unit 210 further includes a center tap terminal (Ct) to connect to resonating capacitor ($C_R$) that generates a resonant frequency output signal. For example, the secondary winding 214 and $C_R$ may be tuned to output the second harmonic ($2f_0$), the third harmonic ($3f_0$), the fifth harmonic ($5f_0$), etc.

Figure 4A:
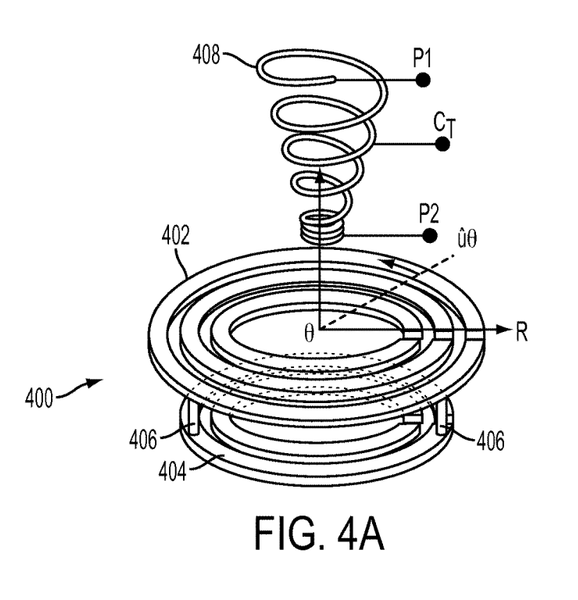
FIGS. 4A-4B are isometric views of a secondary unit included with a coupled resonator transformer according to an embodiment of the disclosure.
Figure 4B:
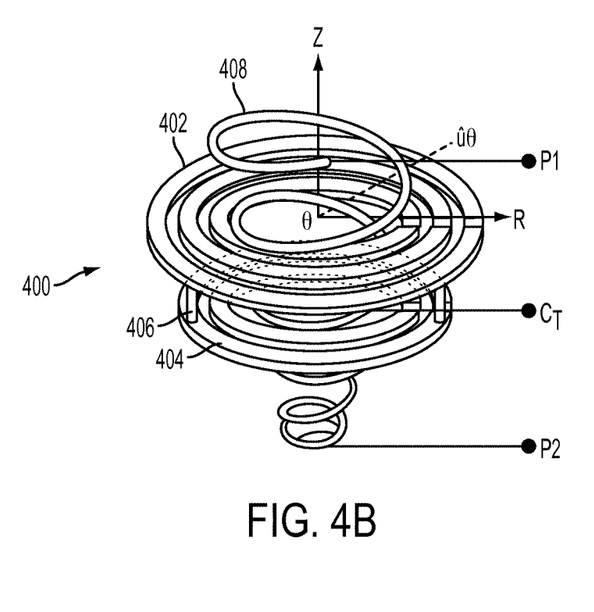

Similar to the primary winding 212, the secondary winding 214 may be formed as a stacked annular winding 400 as illustrated in FIGS. 4A-4B. More specifically, the secondary winding 400 includes a first secondary annular 402 and a second secondary annular 404. The first and second secondary annulars 402, 404 are vertically stacked with respect to one another. One or more electrically conductive vias 406 connect the first and second secondary annulars 402, 404 in series with one another.

In at least one embodiment, the secondary unit 210 includes a tapered cone winding 408 disposed within the void extending through the center of the first and second secondary annulars 402, 404 as further illustrated in FIGS. 4A-4B. The tapered cone winding 408 may include a center-tap terminal (CT), which may be connected to a resonating capacitor (CR) to generate a resonant frequency output signal based on the pre-amplified signal. The resonant frequency output signal is generated without forming an artificial transmission line. Since no artificial transmission line is formed, the tapered cone winding 408 may output a resonant frequency output signal having ultra high frequencies ranging from 500 MHz to 3 GHz. Inter-winding capacitance of the tapered cone winding 408 may be minimized alternating the winding in Z-direction, i.e., the vertical direction. For example, by stretching this tapered cone winding 408 vertically, the tapered cone winding 408 may be tuned to a specific primary inductive reactance and the planar circular spiral multilayer Z-levels used as a secondary. Accordingly, the resonance of the coupled resonator transformer may be tuned by spreading the Z-layer windings on the tapered cone winding 408.

Figure 5:
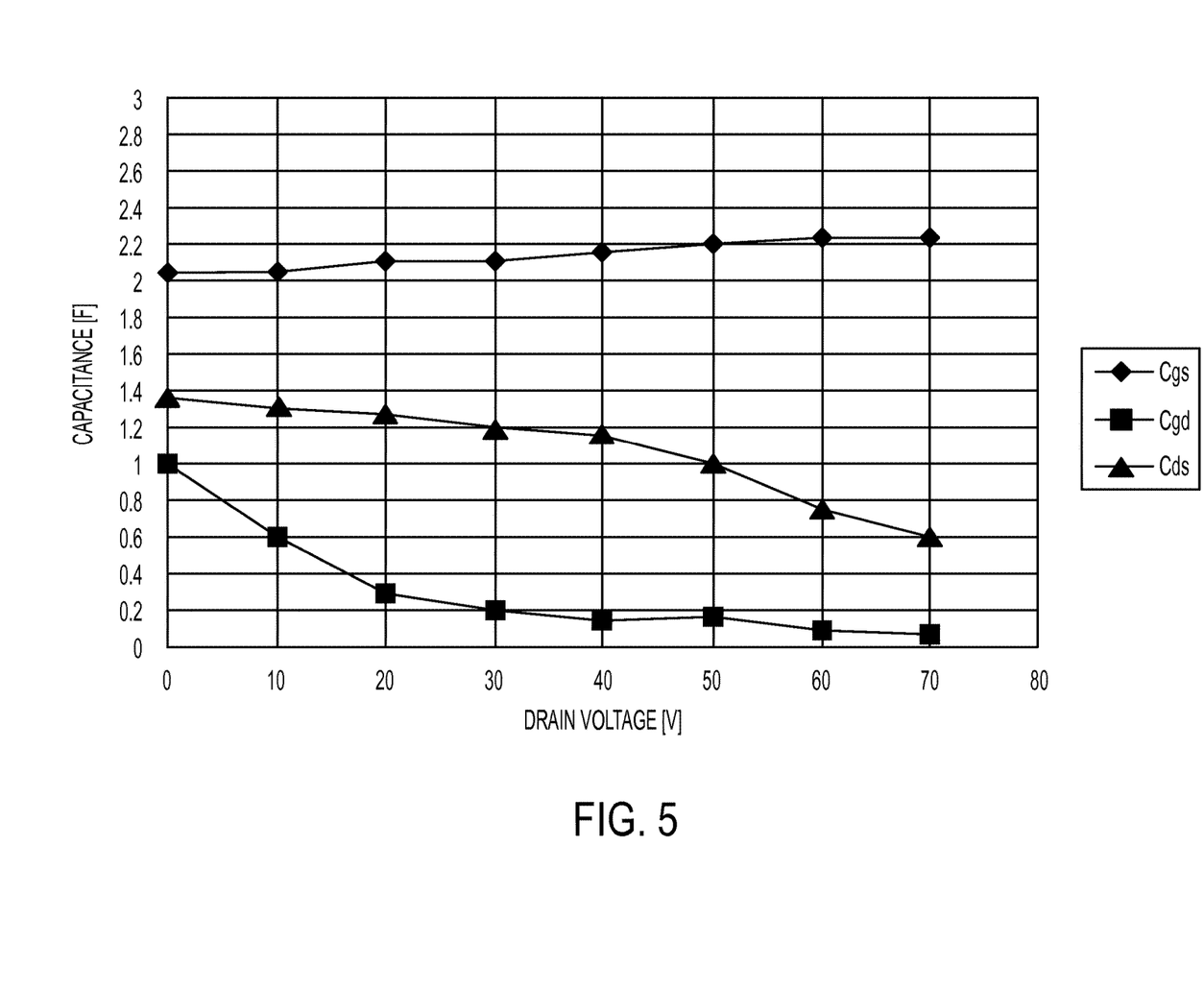
FIG. 5 is line graph illustrating the linearity capacitance of the GaN semiconductor switch included in a switch mode amplifier according to an embodiment of the disclosure.

According to various embodiments described above, at least one new and unexpected result is realized when the output of the coupled resonator transformer having a high frequency (e.g., 1 GHz) is applied to the drain terminal of the semiconductor switch 206 formed from GaN. Referring to FIG. 5, a line graph illustrates the linearity capacitance of the GaN semiconductor switch 206 in response to an input signal generated from the coupled resonator transformer when the input signal follows a nonlinear capacitance characteristic caused by picking proper DC bias points on gate and drain terminals of GaN semiconductor switch 206. Further, capacitance versus voltage (CV) measurements of GaN semiconductor switch 206 are illustrated in response to applying drain voltages to exponentially decrease Cds, while simultaneously applying gate voltages to exponentially maximize Cds. This bias condition provides an operating point that leverages the nonlinear capacitance swing.

The capacitance swing may be modulated from the RF injected signal of the fundamental frequency and the harmonics with respect to amplitude and phase. The GaN semiconductor switch 206 unexpectedly exhibits a non-linear capacitance when the drain terminal voltage of GaN device is operated at higher levels than the recommended drain voltage. More specifically, the RF AC load line across the drain-source connection (Vds) of the GaN semiconductor switch 206 swings approximately 1.2 times the recommended Vds operating voltage to approximately the Vds breakdown voltage, while the gate bias may be simultaneously set to maximize Cds. Conventional methods use AC load lines swings centered at recommended drain voltages swinging Vds (drain to source voltage) from approximately 0.5 times to approximately 1.5 Vds for 28 V GaN FETs. Further, conventional methods also describe that maximized nonlinear capacitance swing is achieved when 28 volt GaN FETs are centered at an operating voltage of approximately 22 V. Unlike the conventional methods, at least one embodiment of the inventive teachings provides a non-linear capacitance region that is unexpectedly found to exponentially change and maximize capacitance swing above the recommended operating Vds of 40 volt GaN FETs that are centered at approximately 50 volt operation to maximize non-linear capacitance swing. Accordingly, at least one embodiment of the disclosure provides a switch mode amplifier 202 having an increased PAE across high input frequencies ranging, for example, from about 500 MHz to about 3 GHz.

Figure 6:
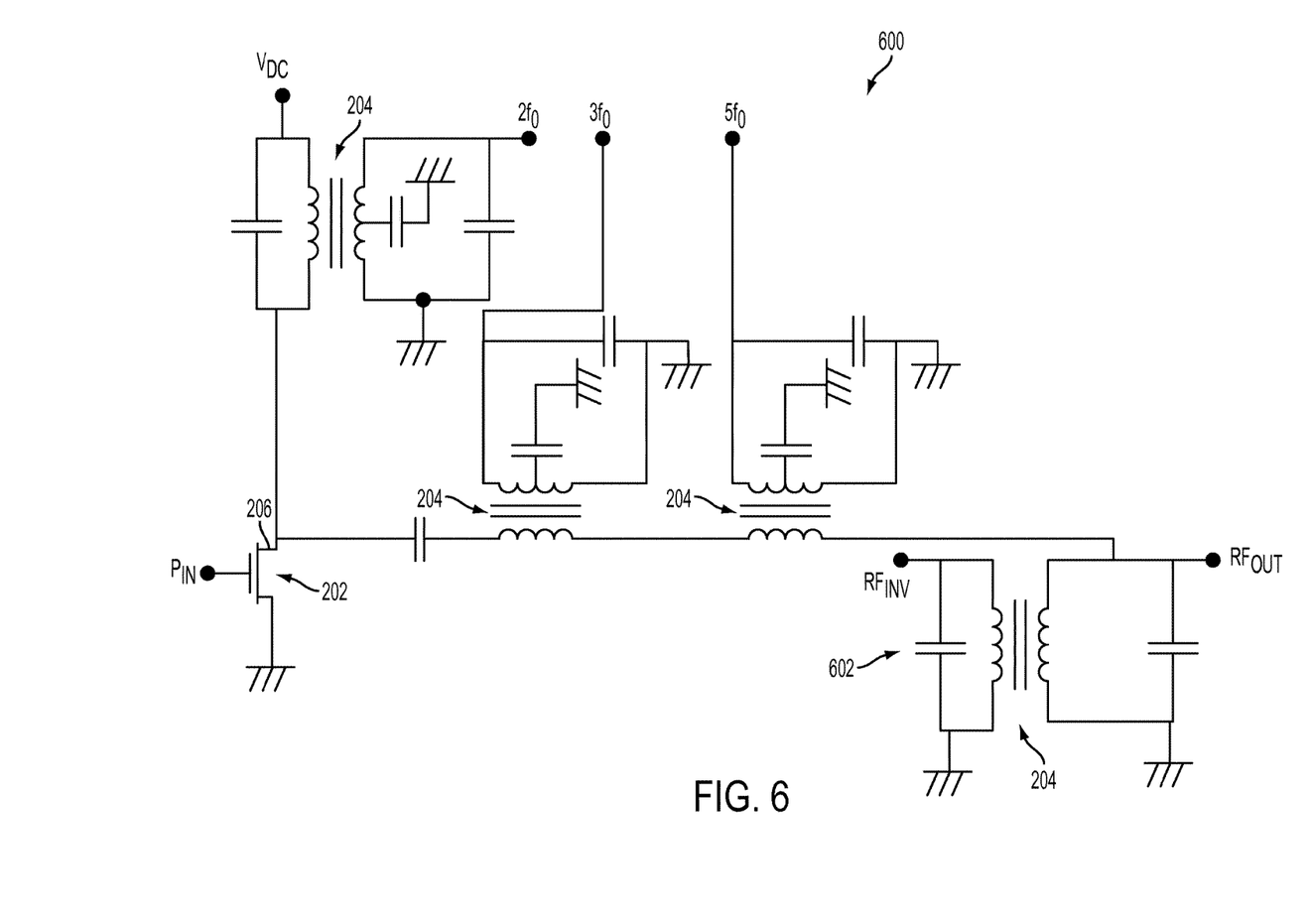
FIG. 6 is a schematic of an impedance amplifier module including a switch mode amplifier and a plurality of coupled resonator transformers according to an embodiment of the disclosure.

Referring now to FIG. 6, an impedance amplifier module 600 is illustrated according to an exemplary embodiment. The impedance amplifier module 600 may be constructed similar to the carrier amplifier module 200 discussed in detail above. The impedance amplifier module 600, however, may further include an inversion unit 602 that inverts the phase at $RF_{INV}$ by 180 degrees with respect to the input signal of the impedance amplifier module 600, i.e., the input power signal. If the same power signal is input to both the carrier module 200 and the impedance amplifier module 600, $RF_{INV}$ may be connected to $RF_{OUT}$ of the carrier amplifier module 200, and the impedance amplifier module 600 may effectively inject an inverted phase to $RF_{OUT}$ that is inverted by 180 degrees with respect to the output of the carrier amplifier module 200, e.g., the output power signal ($P_{OUT}$). The inversion unit 602 may be formed as a transformer having a primary winding that generates the inverted injection signal ($RF_{INV}$).

Figure 7:
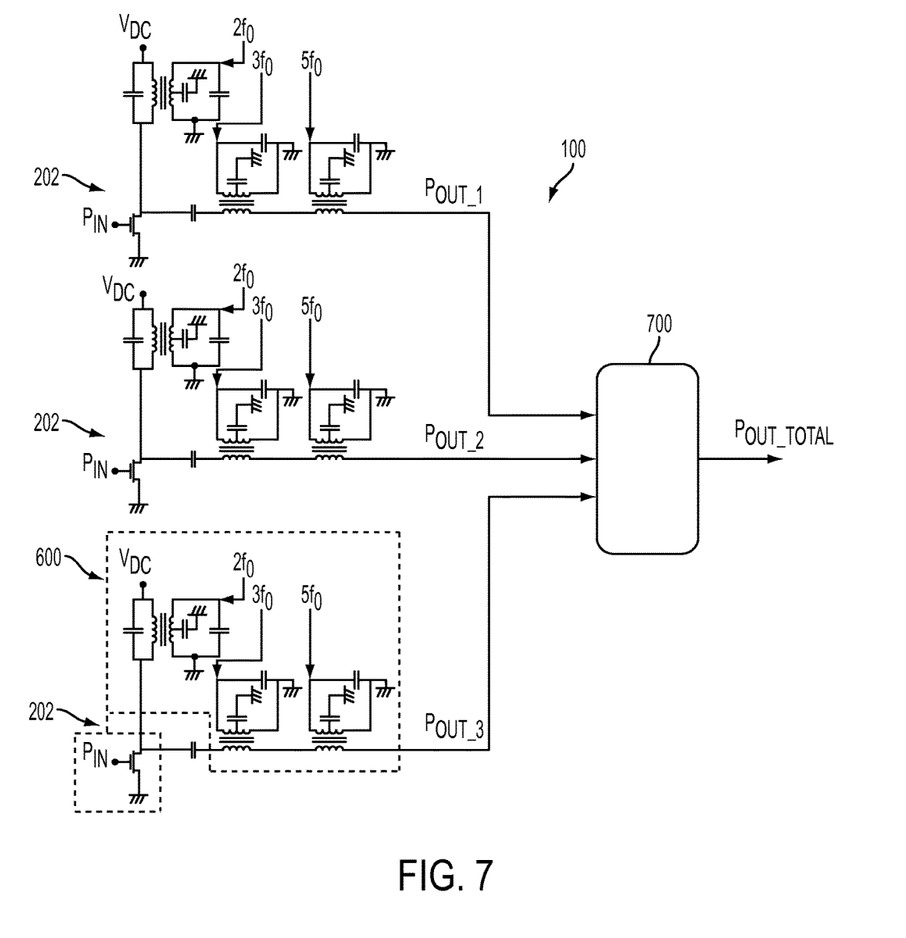
FIG. 7 is a block diagram of a wideband power amplifier including a combiner in electrical communication with a plurality of switch mode amplifiers according to an embodiment of the disclosure.

As mentioned above, the wideband power amplifier module 100 may include a plurality of switch mode amplifiers 202. Each switch mode amplifier 202 may generate a respective RF power, as discussed above. Accordingly, at least one embodiment of the disclosure illustrated in FIG. 7 provides a wideband power amplifier module 100 including a combiner 700 in electrical communication with the plurality of switch mode amplifiers 202. The combiner 700 has an input in electrical communication with the source terminal of each switch mode amplifier 202 to receive an RF power from a respective switch mode amplifier 202. The combiner 700 is configured to sum each RF power ($P_{OUT\_1}$, $P_{OUT\_2}$, $P_{OUT\_3}$, etc.) and generate a combined RF power ($P_{OUT\_TOTAL}$). For example, a wideband power amplifier module 100 according to one embodiment may include, for example, ten (10) switch mode amplifiers 202, each of which outputs an RF power of 100 W. The combiner receives each 100 W output from the respective switch mode amplifier 202, and combines the RF power to generate a combine RF power having a power level of 1000 W.

In at least one embodiment, the combiner 700 comprises an LC network including at least one inductor electrically connected to at least one capacitor. In another embodiment, the combiner comprises 700 a waveguide having a plurality of RF inputs and an RF output, each RF input among the plurality of RF input configured to receive an RF power output from a respective switch mode amplifier 202 and to output the combined RF power at the RF output.

Figure 8:
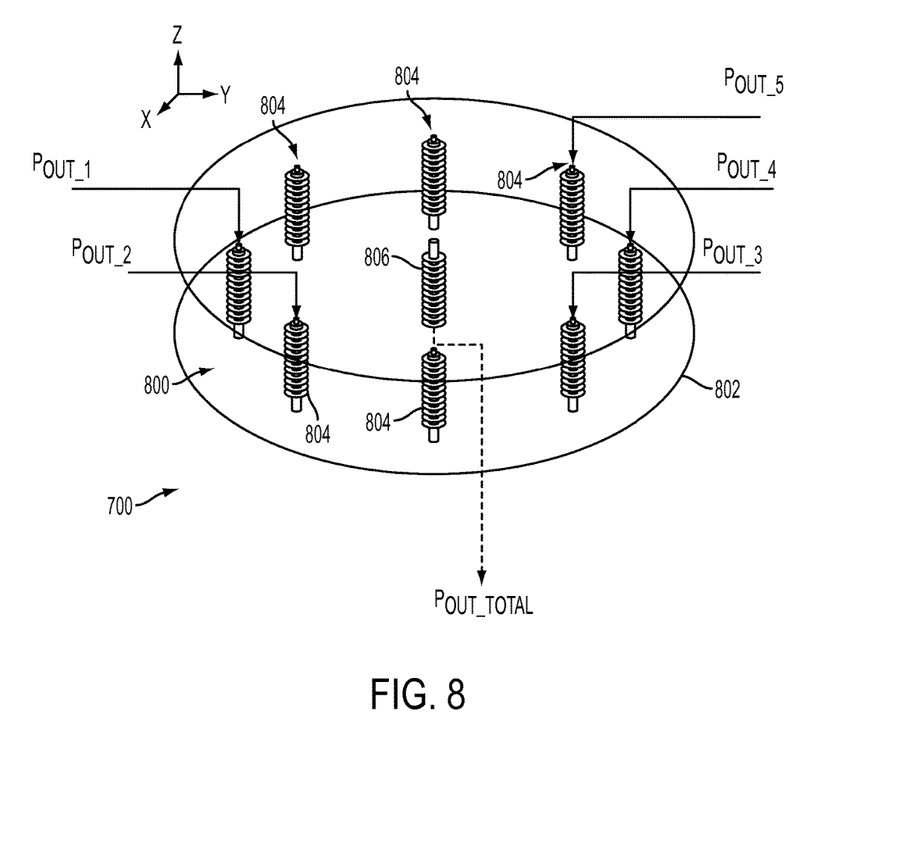
FIG. 8 illustrates a combiner including a radial resonant probe module having a radial waveguide according to an embodiment of the disclosure.

In yet another embodiment, as illustrated in FIG. 8, the combiner 700 comprises a radial resonant probe 800 module including a radial waveguide 802. A plurality of transmitter broadband probes 804 is disposed in the radial waveguide 802, and a receiver broadband probe 806 is magnetically coupled to the plurality of transmitter probes. The receiver broadband probe 806 may be disposed, for example, at a center of the radial waveguide 802, and the plurality of transmitter broadband probes 804 may be arranged about a circumference of the radial waveguide 802 to surround the receiver broadband probe 806. Each transmitter broadband probe 804 has a first port electrically connected to a source terminal (i.e., $RF_{OUT}$) of a respective semiconductor switch 206 and is configured to generate an electromagnetic field having a voltage equal to the RF power output from the respective source terminal $RF_{OUT}$. The radial waveguide 802 directs the electromagnetic field generated from each transmitter broadband probe 804 to the receiver broadband probe 806 such that the combined RF power (i.e., $P_{OUT\_TOTAL}$) is output from an output port of the radial resonant probe module 800.

Figure 9:
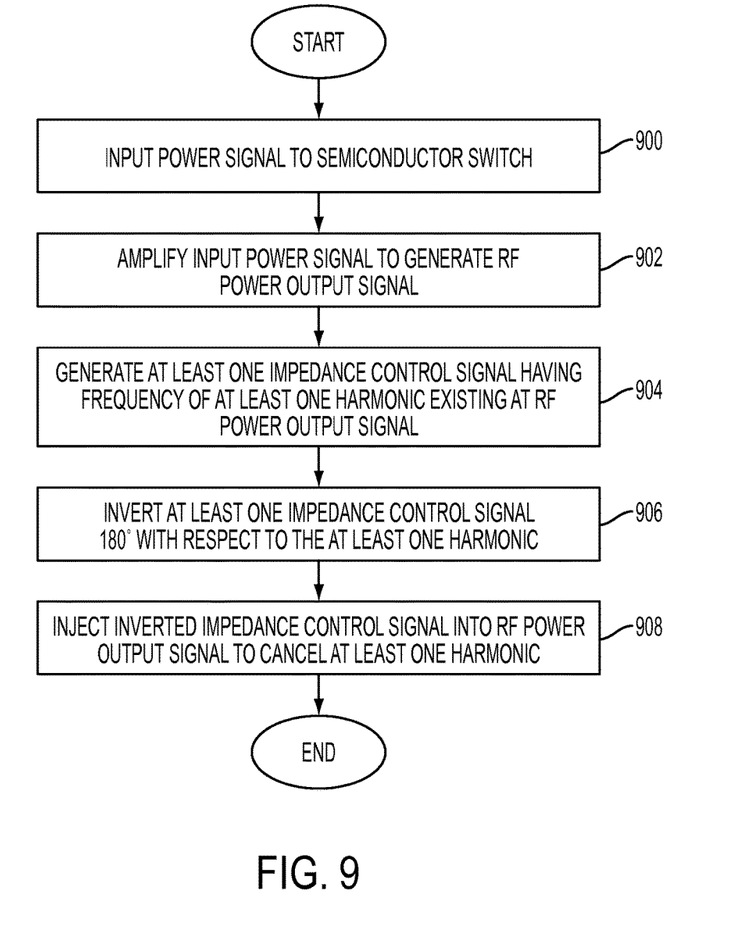
FIG. 9 is a flow diagram illustrating a method of increasing a power added efficiency (PAE) of a wideband power amplifier module including a semiconductor switch according to an embodiment of the disclosure.

Referring now to FIG. 9, a flow diagram illustrates a method of increasing a power added efficiency (PAE) of a wideband power amplifier module including a semiconductor switch according to an embodiment of the disclosure. At operation 900, an input power signal is input to a semiconductor switch. According to at least one embodiment discussed in detail above, the semiconductor switch is a GaN FET. At operation 902, the input power signal is amplified via the semiconductor switch to generate an RF power output signal. At operation 904, at least one impedance control signal is generated. The impedance control signal has a frequency equal to approximately the fundamental frequency of the input power signal, or a frequency equal to approximately a harmonic existing at the RF power output signal. In at least embodiment, a plurality of impedance control signals are generated. The plurality of impedance control signals may include first, second, third and fourth impedance control signals. The first impedance control signal has a frequency of the fundamental frequency ($f_0$), the second impedance control signal has a frequency of the second harmonic frequency ($2f_0$), the third impedance control signal has a frequency of the third harmonic frequency ($3f_0$), and the fourth impedance control signal has a frequency of the fifth harmonic frequency ($5f_0$).

At operation 906, the phase of the at least one impedance control signal is inverted 180 degrees. For example, the phase of the first impedance control signal is inverted 180° with respect to the frequency of the fundamental frequency ($f_0$), the phase of the second impedance control signal is inverted 180° with respect to the frequency of the fundamental frequency ($2f_0$), etc. At operation 908, the at least one inverted impedance control signal is injected into the RF output power signal, thereby canceling one or more harmonics of the RF output power signal and the method ends. For example, the inverted second impedance control cancels the second harmonic frequency ($2f_0$) existing at the RF output power signal, the inverted third impedance control signal cancels the third harmonic frequency ($3f_0$), and the inverted fourth impedance control signal cancels the fifth harmonic frequency ($5f_0$). Accordingly, power added efficiency (PAE) of a wideband power amplifier is increased.

In at least one embodiment discussed in detail above, a broadband power amplifier is capable of operating at high frequencies, such as about 1 GHz or higher, while having an increased PAE ranging from about 25% to about 80%. As will thus be appreciated, among the technical benefits of the above described embodiments is a feature of achieving a non-linear capacitance at a high power output, for example, 100 Watts. Accordingly, a broadband power amplifier capable of handling high power levels and having an increased PAE may be provided.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A coupled resonator transformer to output a resonant frequency signal that drives a switch mode amplifier, the coupled resonator transformer comprising:

a primary unit including a primary winding to receive an input signal that induces an electromagnetic field;

a secondary unit separated from the primary unit via an air gap, the secondary unit including an annular-shaped secondary winding that realizes a pre-amplified signal induced by the electromagnetic field; and a tapered cone winding disposed within the secondary winding, the tapered cone winding including a center-tap terminal connected to a resonating capacitor to generate a resonant frequency output signal based on the pre-amplified signal, wherein the tapered cone winding is configured to output the resonant frequency signal without forming an artificial transmission line to output the resonant frequency output signal, the resonant frequency output signal has a frequency ranging from ranging from 500 MHz to 6 GHz.

\* \* \* \* \*